(12) United States Patent  
Park et al.

(10) Patent No.: US 12,327,784 B2  
(45) Date of Patent: Jun. 10, 2025

(54) SEMICONDUCTOR PACKAGE (71) Applicant: SAMSUNG ELECTRONICS CO., LTD., Suwon-si (KR)

(72) Inventors: Sangcheon Park, Hwaseong-si (KR); Heonwoo Kim, Cheonan-si (KR); Sungwoo Park, Seongnam-si (KR); Chajea Jo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 390 days.

(21) Appl. No.: 17/839,413

(22) Filed: Jun. 13, 2022

(65) Prior Publication Data

US 2023/0088264 A1 Mar. 23, 2023

(30) Foreign Application Priority Data

Sep. 17, 2021 (KR) .................. 10-2021-0124685

(51) Int. Cl.
*H01L 23/498* (2006.01)
*H01L 23/00* (2006.01)

(52) U.S. Cl.
CPC .......... *H01L 23/49833* (2013.01); *H01L 23/49822* (2013.01); *H01L 23/49894* (2013.01); *H01L 24/16* (2013.01); *H01L 24/05* (2013.01); *H01L 24/13* (2013.01); *H01L 24/81* (2013.01); *H01L 2224/05624* (2013.01); *H01L 2224/05647* (2013.01); *H01L 2224/05684* (2013.01);
(Continued)

(58) Field of Classification Search
CPC ......... H01L 23/49833; H01L 23/49822; H01L 23/49894; H01L 24/16; H01L 24/05; H01L 24/13; H01L 24/81; H01L 2224/16227; H01L 21/6835; H01L 21/4857; H01L 2221/68359; H01L 23/49816; H01L 23/5383; H01L 2221/68345; H01L 2221/68368
See application file for complete search history.

(56) References Cited

U.S. PATENT DOCUMENTS 9,478,474 B2 10/2016 Chen et al.
9,583,431 B1 2/2017 Rahman et al.
(Continued)

OTHER PUBLICATIONS

Vasilis F. Pavlidis et al., Power Distribution Paths in 3-D ICS, GLSVLSI'09, May 10-12, 2009, 263-268, Boston, Massachusetts, USA.

*Primary Examiner* — Douglas W Owens
(74) *Attorney, Agent, or Firm* — Fish & Richardson P.C.

(57) ABSTRACT

A semiconductor package includes an interposer substrate on a package substrate. The interposer substrate includes an upper pad on an upper surface of the insulating layer, a lower pad on a lower surface of the insulating layer, and a redistribution structure penetrating the insulating layer between the upper surface and the lower surface to connect the upper pad and the lower pad. A semiconductor chip is disposed above the interposer substrate and connected to the upper pad, and a connection bump directly contacts a lower surface of the lower pad. The redistribution structure includes redistribution layers and redistribution vias connected to the redistribution layers, wherein each of the redistribution layers and each of the redistribution vias includes a metal material layer and a plating seed layer, and the lower pad directly contacts the plating seed layer.

20 Claims, 10 Drawing Sheets (52) U.S. Cl.
CPC .............. *H01L 2224/13111* (2013.01); *H01L 2224/13139* (2013.01); *H01L 2224/13147* (2013.01); *H01L 2224/16227* (2013.01); *H01L 2224/81447* (2013.01)

(56) References Cited

U.S. PATENT DOCUMENTS

| | | |
|---|---|---|
| 10,522,471 B2 | 12/2019 | Suk et al. |
| 10,535,608 B1 | 1/2020 | Rubin et al. |
| 10,833,002 B2 | 11/2020 | Kim |
| 11,581,284 B2* | 2/2023 | Kang ................ H01L 23/49811 |
| 11,854,948 B2* | 12/2023 | Kim ................... H01L 25/0657 |
| 2012/0153445 A1* | 6/2012 | Son ................... H01L 23/49833 |
| | | 257/668 |
| 2012/0248439 A1* | 10/2012 | Lee ................... H01L 23/49838 |
| | | 257/777 |
| 2013/0044554 A1 | 2/2013 | Goel et al. |
| 2014/0070406 A1 | 3/2014 | Mohammed et al. |
| 2020/0168550 A1 | 5/2020 | Ryu et al. |
| 2021/0028061 A1* | 1/2021 | Farooq .................... H01L 25/50 |
| 2022/0320019 A1* | 10/2022 | Chang ................. H03H 7/0115 |
| 2023/0114274 A1* | 4/2023 | Lee .................... H01L 23/3135 |
| | | 257/199 |

* cited by examiner

FIG. 19 under 35 U.S.C. § 119 to
SEMICONDUCTOR PACKAGE

CROSS-REFERENCE TO RELATED APPLICATION

This application claims priority under 35 U.S.C. § 119 to Korean Patent Application No. 10-2021-0124685 filed on Sep. 17, 2021 in the Korean Intellectual Property Office, the subject matter of which is hereby incorporated by reference in its entirety.

BACKGROUND

The inventive concept relates generally to semiconductor packages.

A semiconductor package may be mounted on a substrate (e.g., a main board) using various types of connection bumps. In order to provide stable electrical connection between the semiconductor package and substrate, electrode pads may be disposed between a redistribution layer of the semiconductor package and the connection bumps.

SUMMARY

Embodiments of the inventive concept provide semiconductor packages having improved reliability and features enabling more efficient manufacture.

According to an aspect of the inventive concept, a semiconductor package may include; a package substrate, an interposer substrate on the package substrate and including an insulating layer having an upper surface and an opposing lower surface, an upper pad on the upper surface of the insulating layer, a lower pad on the lower surface of the insulating layer, and a redistribution structure penetrating the insulating layer between the upper surface and the lower surface to connect the upper pad and the lower pad, a semiconductor chip disposed above the interposer substrate and connected to the upper pad and a connection bump directly contacting a lower surface of the lower pad, wherein the redistribution structure includes redistribution layers and redistribution vias connected to the redistribution layers, each of the redistribution layers and each of the redistribution vias includes a metal material layer and a plating seed layer, and the lower pad directly contacts the plating seed layer.

According to an aspect of the inventive concept, a semiconductor package may include; an interposer substrate including an insulating layer, an upper pad on an upper surface of the insulating layer, a lower pad on a lower surface of the insulating layer, and a redistribution structure penetrating through the insulating layer to connect the upper pad and the lower pad, a semiconductor chip disposed above the interposer substrate and connected to the upper pad, and a connection bump directly contacting a lower surface of the lower pad, wherein the redistribution structure includes a redistribution layer and a redistribution via connected to the redistribution layer, the redistribution layer includes a first plating seed layer extending along a side surface and a lower surface of the redistribution layer, the redistribution via includes a second plating seed layer extending along a side surface and a lower surface of the redistribution via, and the lower pad directly contacts the second plating seed layer.

According to an aspect of the inventive concept, a semiconductor package may include; a package substrate, an interposer substrate on the package substrate and including an insulating layer, an upper pad on an upper surface of the insulating layer, a lower pad on a lower surface of the insulating layer, and a redistribution structure penetrating through the insulating layer to connect the upper pad and the lower pad, and a semiconductor chip disposed above the interposer substrate and connected to the upper pad, wherein the insulating layer includes at least one of SiO2, SiN, and SiCN, the redistribution structure includes a redistribution layer and a redistribution via connected to the redistribution layer, the redistribution layer includes a first plating seed layer extending along a side surface and a lower surface of the redistribution layer, the redistribution via includes a second plating seed layer extending along a side surface and a lower surface of the redistribution via, and the lower pad directly contacts the second plating seed layer.

BRIEF DESCRIPTION OF DRAWINGS

The above and other aspects, features, and advantages of the inventive concept will more clearly understood upon consideration of the following detailed description together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
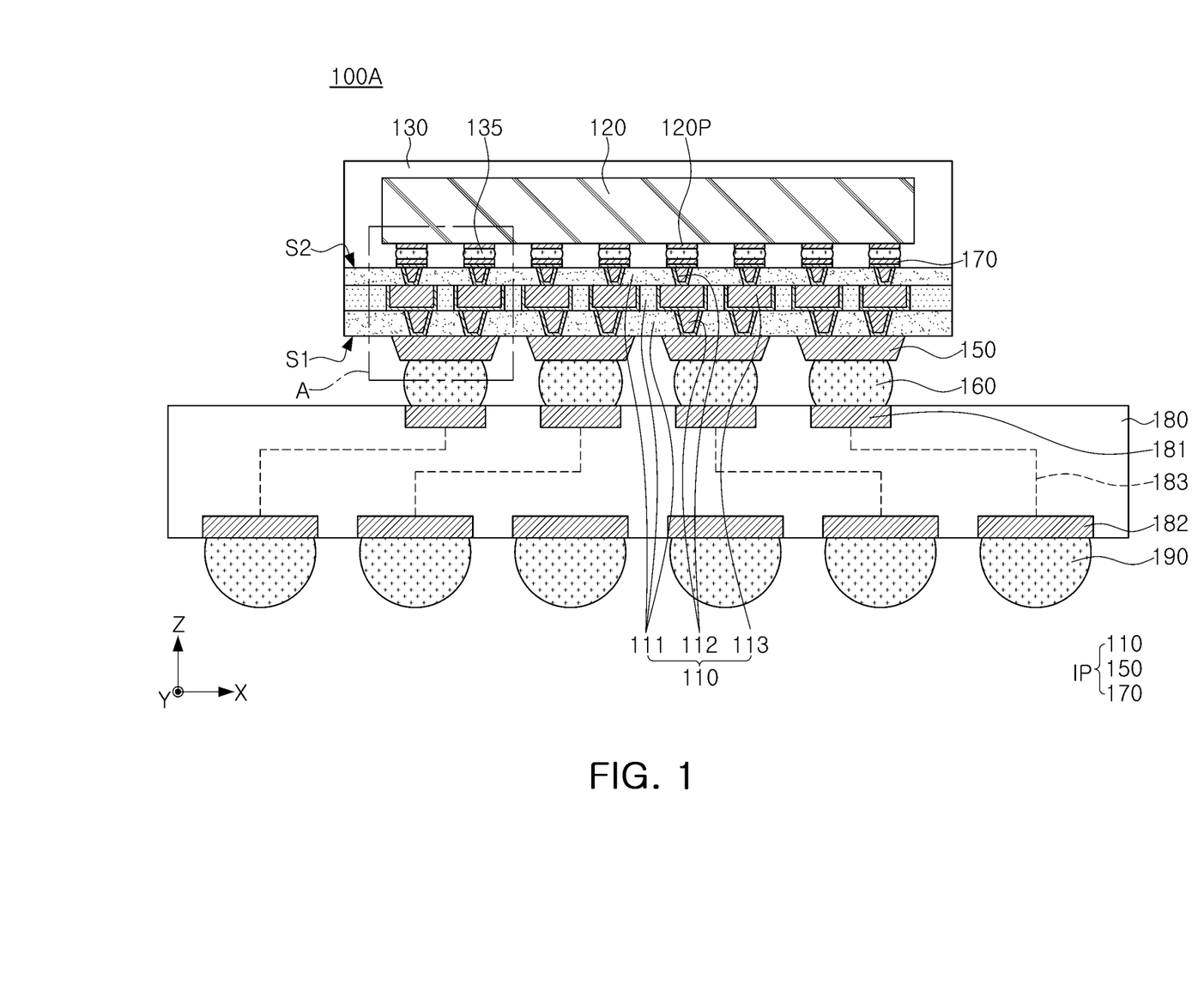
FIG. 1 is a cross-sectional view illustrating a semiconductor package according to embodiments of the inventive concept.
Figure 2:
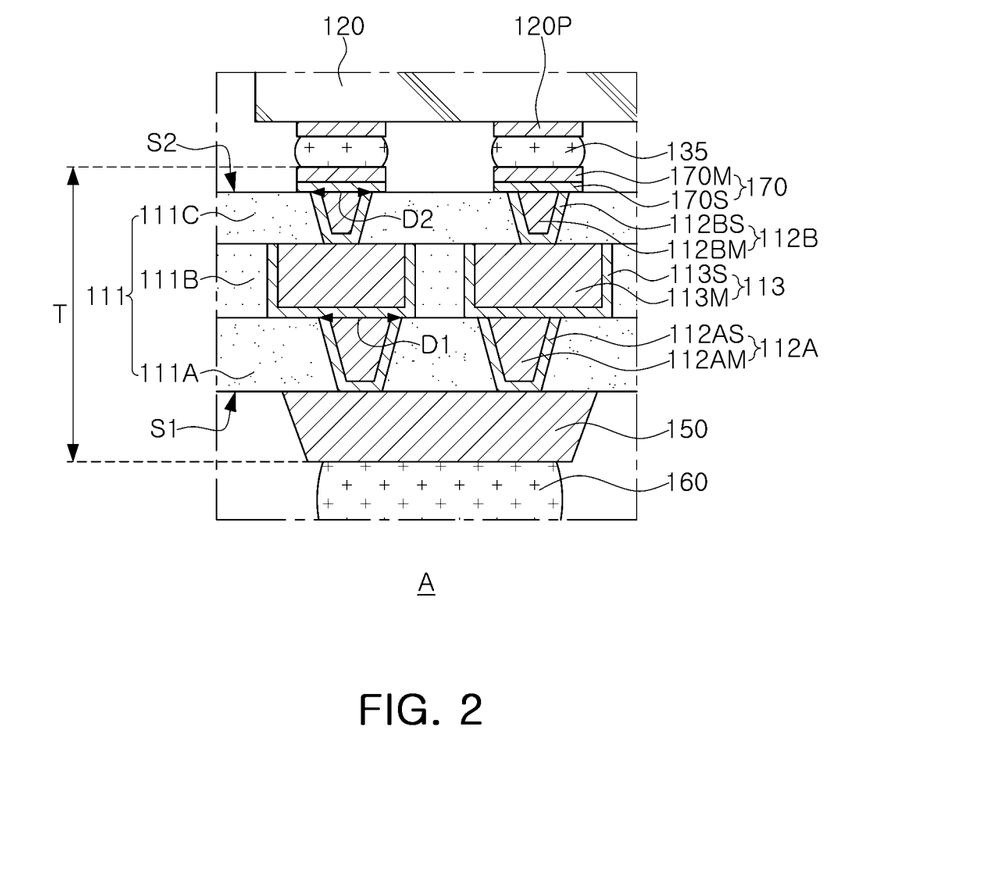
FIG. 2 is an enlarged view of region 'A' indicated in FIG. 1.

FIG. 1 is a cross-sectional view illustrating a semiconductor package 100A according to embodiments of the inventive concept, and FIG. 2 is an enlarged view of region 'A' indicated in FIG. 1.

Referring to FIGS. 1 and 2, the semiconductor package 100A may include a package substrate 180, an interposer substrate IP on the package substrate 180, a semiconductor chip 120 on the interposer substrate IP, connection portions 135 for connecting the semiconductor chip 120 to the interposer substrate IP, an encapsulation layer 130 for sealing the semiconductor chip 120, and connection bumps 160 respectively disposed on lower pads 150.

The package substrate 180 may include a lower substrate pad 182 disposed on a lower surface of a body, a upper substrate pad 181 disposed on an upper surface of the body, and a redistribution circuit 183 electrically connecting the lower substrate pad 182 and the upper substrate pad 181. In some embodiments, the package substrate 180 may be a support substrate on which the interposer substrate IP may be mounted (e.g., mechanically assembled and/or electrically connected). The package substrate 180 may include at least one of, for example, a printed circuit board (PCB), a ceramic substrate, a glass substrate, and a tape wiring board. The body of the package substrate 180 may include one or more material(s) depending on the type of the substrate. For example, assuming that the package substrate 180 is a PCB, it may include a wiring layer provided on the lower and/or upper surface(s) of the body using (e.g.) a copper clad lamination technique. Alternately or additionally, a solder resist layer may be formed on the lower and/or upper surface(s) of the package substrate 180.

The upper substrate pad 181, the lower substrate pad 182, and the redistribution circuit 183 may collectively form an electrical path between the upper surface and the lower surface of the package substrate 180. At least one of the upper substrate pad 181, the lower substrate pad 182, and the redistribution circuit 183 may include at least one electrically conductive material, such as for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C). The redistribution circuit 183 may include one or more arrangement(s) of redistribution layer(s) and/or and via(s). An external connection terminal 520 connected to the lower substrate pad 182 may be disposed on the lower surface of the package substrate 180. Here, the external connection terminal 520 may include at least one of, for example, Sn, In, Bi, Sb, Cu, Ag, Zn and Pb.

The interposer substrate IP may be disposed between the semiconductor chip 120 and the package substrate 180, and may functionally serve to variously connect the semiconductor chip 120 and the package substrate 180. In some embodiments, the interposer substrate IP may be used to communicate (e.g., transmit and/or receive) signal(s) (e.g., power/ground signals, data signals, address signals and/or command/control signals) between the package substrate 180 and the semiconductor chip 120. Those skilled in the art will recognize that the interposer substrate IP may be variously configured with electrical paths, active elements and/or passive elements.

In the illustrated example of FIGS. 1 and 2, the interposer substrate IP may include an insulating layer 111, upper pads 170, lower pads 150, and a redistribution structure 110. In some embodiments, the interposer substrate IP may have a thickness 'T' ranging from about 2.4 μm to about 10 μm.

The insulating layer 111 includes an upper surface S2 and an opposing lower surface S1 and may be implemented in some embodiments by stacking a plurality of material layers. For example, as illustrated in FIG. 2, the insulating layer 111 may include a first insulating layer 111A, a second insulating layer 111B on the first insulating layer 111A, and a third insulating layer 111C on the second insulating layer 111B. However, this is just one working example, and those skilled in the art will recognize that the insulating layer 111 may include any reasonable number of vertically stacked material layers.

That is, the insulating layer 111 may be formed of one or more insulating material layer(s). For example, the insulating layer 111 may include at least one of, for example, $SiO_2$, SiN, and SiCN. In some embodiments, a lowermost insulating layer and/or an uppermost insulating layer of the insulating layer III may be formed of a material (e.g., a first material) different than a material (e.g., a second material) used to form intermediate insulating layers between the lowermost insulating layer and the uppermost insulating layer. This option is particularly useful if the lowermost insulating layer and/or the uppermost insulating layer of the insulating layer III serve as a protective layer against impact and/or contamination.

In some embodiments, the insulating layers may include a polyimide material or a polymer such as ploybenzoxazole (PBO). More particularly in some embodiments, the first insulating layer 111A (e.g., the lowermost insulating layer) and the third insulating layer 111C (e.g., the uppermost insulating layer) may include a polyimide or ploybenzoxazole (PBO), and the second insulating layer 111B (e.g., the intermediate insulating layer) may include at least one of, for example, $SiO_2$ and SiN.

An upper pad 170 may be disposed on the upper surface S2 of the insulating layer 111. The upper pad 170 may include a seed layer 170S and a metal material layer 170M stacked on the seed layer 170S. Here, the seed layer 170S may be used as a plating seed layer during an electroplating process forming the upper pad 170. Thus, the seed layer 170S may include the same material as the metal material layer 170M. For example, the metal material layer 170M may include copper (Cu), and the seed layer 170S—having a multi-layer structure—may include a lower layer of Ti and an upper layer of Cu. In some embodiments, a width of upper pads 170 may be less than a width of lower pads 150. (In this regard, the term "width" is used to denote a dimension extending in a first horizontal (or X-) direction, assuming a geometric space defined by the first horizontal direction, a second horizontal (or Y-) direction intersecting the first horizontal direction, and a vertical (or Z-) direction substantially orthogonal to the first horizontal and second horizontal directions. See. e.g., the coordinate axes shown in FIG. 1).

Lower pads 150 may be disposed on the lower surface S1 of the insulating layer 111. In some embodiments, lower pads 150 may be formed of a metal material without a separate seed layer. Accordingly, the metal material may be exposed on upper, side and/or lower surface(s) of the respective lower pads 150. In some embodiments, the metal material may include Cu. The upper surface of each respective lower pad 150 may directly contact the lower surface S1 of the redistribution structure 110. For example, in some embodiments, the respective upper surfaces of the lower pads 150 may directly contact seed layers 112AS of the lower redistribution vias 112A. The lower surface of each of the lower pads 150 may directly contact a corresponding one of the connection bumps 160. (In this regard, the term "directly contacts" denotes an arrangement of two elements or materials within a first element or material contacts a second element or material without any intervening element(s) and/or material(s)).

The redistribution structure 110 may be used to electrically and variously connect the upper pads 170 and the lower pads 150 through the insulating layer 111. The redistribution structure 110 may include one or more redistribution layer(s) 113 as well as one or more redistribution via(s) 112. Here, the redistribution layers 113 and the redistribution vias 112 may be vertically stacked and electrically spaced apart one from the other by intervening insulating layer(s). Thus, assuming that the insulating layer 111 includes multiple stacked layers, the redistribution layers 113 and the redistribution vias 112 may be variously formed through the multiple stacked insulating layers. In this manner, the redistribution layers 113 and the redistribution vias 112 may be used to effectively redistribute electrical connections associated with the semiconductor chip 120 across an area greater than the horizontal footprint of the semiconductor chip 120 (e.g., an area covered by the semiconductor chips 120 and defined by the first horizontal and second horizontal directions). Accordingly, the redistribution layers 113 may extend in at least one of the first horizontal direction and the second horizontal direction, and the multiple stacked insulating layers may be correspondingly spaced apart one from the other in the vertical direction.

As a result, the redistribution vias 112 may be used to vertically and variously connect the redistribution layers 113. In some embodiments, a diameter for each of the redistribution vias 112 may gradually decrease as the redistribution via 112 extends vertically towards the interposer substrate IP.

In some embodiments like the one illustrated in FIG. 2, the redistribution vias 112 may include lower redistribution vias 112A respectively connected to lower redistribution layers 113 (or lower portions of the redistribution layer 113) and upper redistribution vias 112B connected to upper redistribution layers 113 (or upper portions of the redistribution layer 113). In such embodiments, a first diameter D1 of lower redistribution vias 112A may be greater than a second diameter D2 of upper redistribution vias 112B.

In some embodiments, the redistribution vias 112 may each have a substantially cylindrical shape characterize by a width that narrows with vertical descent, such that side surfaces angle out and upward from a lower horizontal plane. The illustrated example of FIG. 2 assumes that each of the redistribution vias 112 is completely filled with one or more conductive materials. However, this need not always be the case and the design and composition of the redistribution vias 112 may vary by design. For example, the redistribution vias 112 may have a conformal via shape in which a metal material is formed on an inner walls of the via hole.

Recognizing that combination(s) of the redistribution layers 113 and redistribution vias 112 may be used to communicate various signals associated with the semiconductor chip 120, one or more of the redistribution layers 113 may be designated for use as a ground layer, a power layer, or a signal (e.g., a command/control, address and/or data) layer.

One or more of the redistribution vias 112 may be designated for use as a ground via, a power via, or a signal (e.g., a command/control, address and/or data) via. Further in this regard, respective diameters for the ground via(s), the power via(s), and the signal via(s) may vary according to via type. For example, the diameter of a ground via and/or the diameter of a power via may be greater than a diameter of a signal via.

Referring to FIG. 2, the redistribution layer 113 and the redistribution vias 112A and 112B may respectively include; seed layers 113S, 112AS, and 112BS and metal material layers 113M, 112AM, and 112BM and respectively disposed seed layers 113S, 112AS, and 112BS. In some embodiments, a first plating seed layer may be used to seed the redistribution layer 113 and a second plating seed layer may be used to seed the redistribution vias 112. The first plating seed layer and the second plating seed layer may be substantially the same type of plating seed layers or may be different in terms of material(s) composition, thickness, processing conditions, etc.

The seed layers 113S, 112AS, and 112BS may extend along a side surface and a lower surface of the redistribution layer 113 and a side surface and a lower surface of the redistribution vias 112A and 112B. The seed layers 113S, 112AS, and 112BS may be used as plating seed layers during an electroplating process used to form the metal material layers 113M, 112AM, and 112BM. The seed layers 112AS and 112BS and the metal material layers 112AM and 112BM of the redistribution layer 113 and the redistribution vias 112A and 112B may include the same material as a seed layer 117S and a metal material layer 117M of the upper pad 170. The seed layers 113S, 112AS, and 112BS may include the same material as the metal material layers 113M, 112AM, and 112BM. For example, the metal material layers 113M, 112AM, and 112BM may include Cu, and the seed layers 113S, 112AS, and 112BS—assumedly including a multi-layer structure—may include a lower layer of Ti and an upper layer of Cu.

Each of the connection bumps 160 may be electrically connected to a corresponding one of the lower pads 150 on the lower surface S1 of the interposer substrate IP. Thus, the interposer substrate IP may be mounted on the package substrate 180 using the connection bumps 160, such that the connection bumps 160 may be variously connected to the redistribution structure 110 through the lower pads 150. In some embodiments, one or more of the lower pads 150 used to communicate a power signal or a ground signal may variously connected to the connection bumps 160, such that the number of the lower pads 150 is greater than the number of the connection bumps 160.

Respective connection bumps 160 may have a land, ball, or pin shape, and may include, for example, Sn or a Sn alloy (e.g., Sn—Ag—Cu).

The semiconductor chip 120 may include connections pads 120P that connect the semiconductor chip 120 to the interposer substrate IP. In this manner, for example, one or more semiconductor chip(s) 120 may be mounted on the interposer substrate IP. Here, the semiconductor chips 120 may include the same type or different types of semiconductor chips semiconductor chips. For example, the semiconductor chips 120 may include one or more logic chip(s) and/or one or more memory chip(s). The logic chip(s) may include, for example, a micro-processor, a central processing unit (CPU), a controller, an application specific integrated circuit (ASIC), etc. The memory chip(s) may include, for example, a volatile memory (e.g., a dynamic random access memory (RAM) (DRAM) or a static RAM (SRAM)), and/or a non-volatile memory (e.g., a flash memory).

Further in this regard, in some embodiments, the semiconductor chip 120 may be mounted on the upper pads 170 of the interposer substrate IP using a flip-chip bonding method. The semiconductor chip 120 may include a device layer disposed below the connection pads 120P on which an integrated circuit (IC) may be disposed.

A body of the semiconductor chip 120 may include at least one of, for example silicon (Si) and germanium (Ge).

The connection pads 120P may include at least one of, for example, tungsten (W), Al, and Cu. A passivation layer (e.g., a silicon oxide layer and/or a silicon nitride layer) through which portions of the connection pads 120P may be exposed may be additionally disposed on a lower surface of the semiconductor chip 120.

The connection portions 135 may respectively connect the semiconductor chip 120 to the upper pads 170 of the interposer substrate IP. The connection portions 135 may have a land, ball, or pin shape, and may include, for example, Sn or an Sn alloy (e.g., Sn—Ag—Cu).

In some embodiments, an underfill layer substantially surrounding the respective connection portions 135 may be disposed between the semiconductor chip 120 and the upper pads 170. However, in some embodiments, the semiconductor chip 120 may be mounted on the upper pads 170 using a wire bonding technique.

The encapsulation layer 130 may substantially encapsulate the semiconductor chip 120 to protect the semiconductor 120 from impact and/or contamination. Thus, the encapsulation layer 130 may cover side surfaces and an upper surface of the semiconductor chip 120, but other embodiments may include a different encapsulant disposition. The encapsulation layer 130 may include at least one insulating material, such as for example, a thermosetting insulating resin, an epoxy resin, a thermoplastic insulating resin such as a polyimide, or prepreg including an inorganic filler and/or a glass fiber, an Ajinomoto Build-up Film (ABF), FR-4, a bismaleimide triazine (BT), an epoxy molding compound (EMC), or Photo-Imageable Dielectric (PID).

In some embodiments wherein the interposer substrate IP of the semiconductor package 100A does not include a Si substrate and a via electrode penetrating through the Si substrate, the interposer substrate IP may be formed with a relatively, very thin thickness T, as compared with interposer substrates including a Si substrate and corresponding electrode.

Figure 3:
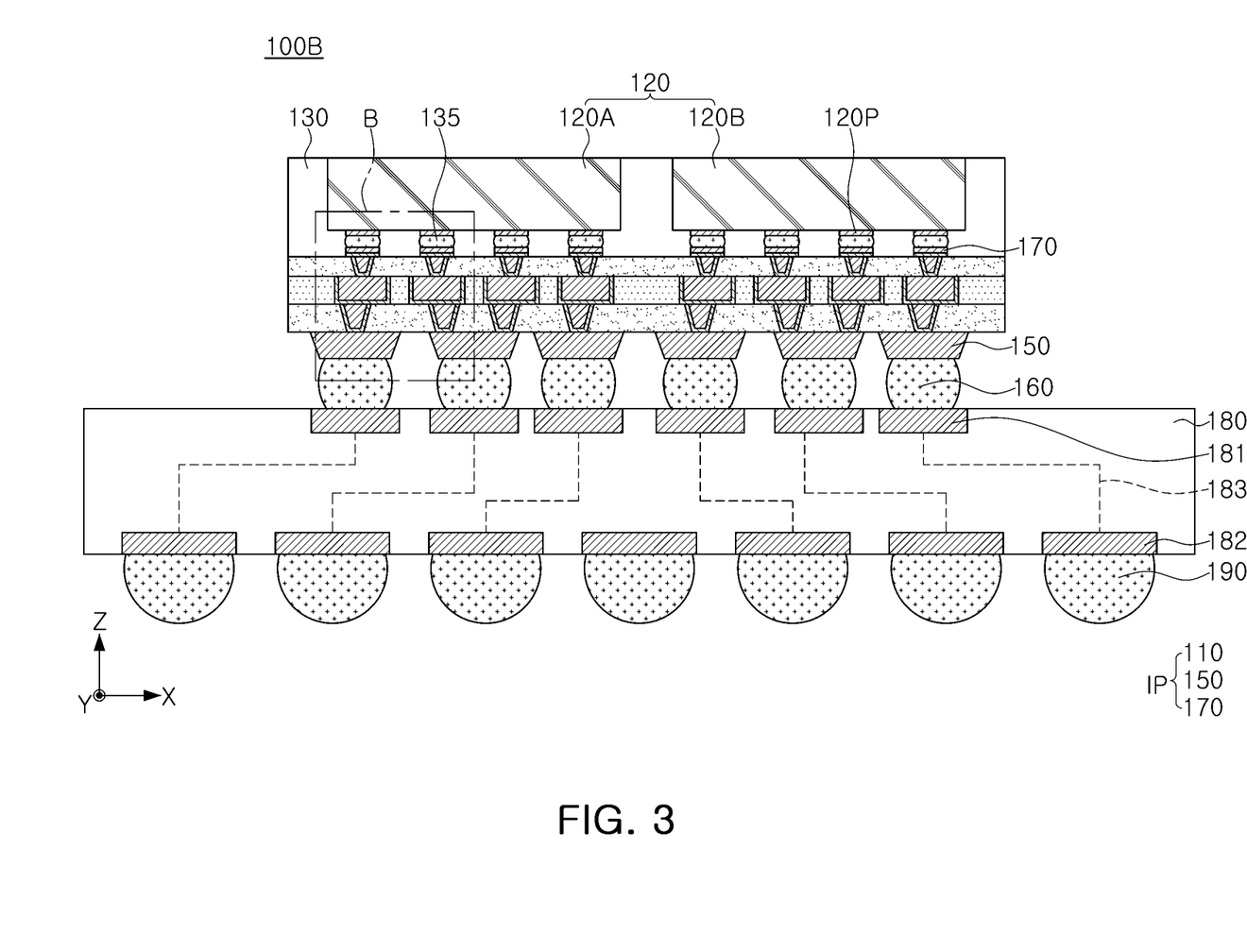
FIG. 3 is a cross-sectional view illustrating a semiconductor package according to embodiments of the inventive concept.
Figure 4:
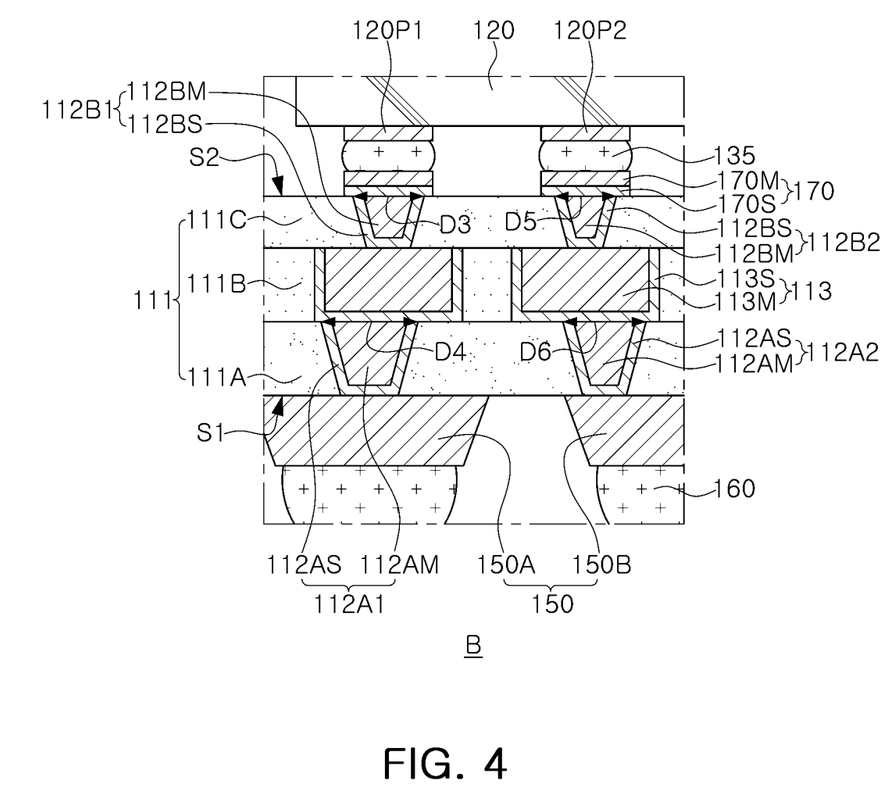
FIG. 4 is an enlarged view of region 'B' of FIG. 3.

Of note, the manufacture of the semiconductor package 110A is relatively simple and straight-forward, as compared with the manufacture of semiconductor packages including an interposer substrate including a Si substrate and corresponding electrode, since process(es) used to thin the Si substrate and/or expose the corresponding electrode are not required. Further, since the semiconductor package 100A of FIGS. 1 and 2 does not include a seed layer on the lower pads 150 of the interposer substrate IP, respective, metallic connection bumps 160 may directly contact the lower pads 150. Accordingly, adhesion between respective the lower pads 150 and connection bumps 160 may be improved, and overall reliability of the semiconductor package 100A may be improved accordingly. Given the more simple manufacturing approach and greater reliability, the time and cost required to mass produce the semiconductor package 100A may be less, as compared with semiconductor packages including an interposer substrate including a Si substrate and corresponding electrode FIG. 3 is a cross-sectional view of a semiconductor package 100B according to embodiments of the inventive concept, and FIG. 4 is an enlarged view of region 'B' indicated in FIG. 3.

By way of comparison with the semiconductor package 100A of FIGS. 1 and 2, the semiconductor package 100B includes a first semiconductor chip 120A and a second semiconductor chip 120B, wherein the encapsulation layer 130 does not cover upper surfaces of the first semiconductor chip 120A and the second semiconductor chip 120B.

Further, redistribution vias of the semiconductor package 100B may include power vias (e.g., vias that are used to communicate a power voltage) and signal vias (e.g., vias used to communicate signals), wherein a diameter of the power vias is greater than a diameter of the signal vias. That is, referring to FIG. 4, upper redistribution power vias 112B1 having a diameter D3 which is greater than a diameter D5 of the upper redistribution signal vias 112B2. And lower redistribution power vias 112A1 having a diameter D4 which is greater than a diameter D6 of lower redistribution signal vias 112A2. (Here, all redistribution via diameters may be measured at respective upper surfaces, for example). With this configuration, it is possible to increase a cross-sectional area of the redistribution power vias within the limited area provided by the interposer substrate IP.

In the context of the package substrate 100A illustrated in FIGS. 1 and 2, FIGS. 5 to 19 are related cross-sectional views illustrating a method of manufacture for semiconductor packages according to embodiments of the inventive concept.

Figure 5:
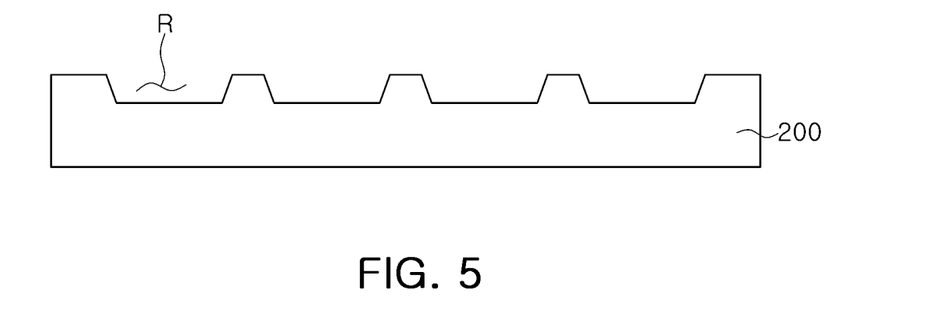
FIGS. 5, 6, 7, 8, 9, 10, 11, 12, 13, 14, 15, 16, 17, 18 and 19 (hereafter collectively, "FIGS. 5 to 19") are related cross-sectional views illustrating a method of manufacture for semiconductor packages according to embodiments of the inventive concept.

Referring to FIG. 5, a recess R may be formed in an upper surface of a semiconductor substrate 200. The recess R may be understood as forming the lower pad 150 of the semiconductor package 100A of FIG. 1 described above. Here, the semiconductor substrate 200 may be a Si substrate.

Figure 6:
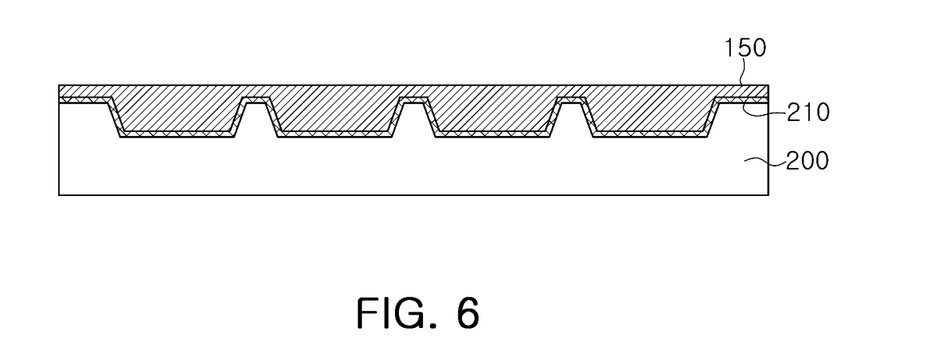

Referring to FIG. 6, a seed layer 210 may be formed to cover the semiconductor substrate 200, and lower pads 150 may be formed by filling a metal material using an electroplating process. For example, the lower pads 150 may be formed by depositing a metal material such as Cu, and the seed layer 210 may have a multilayer structure including a lower layer including Ti and an upper layer including Cu.

Figure 7:
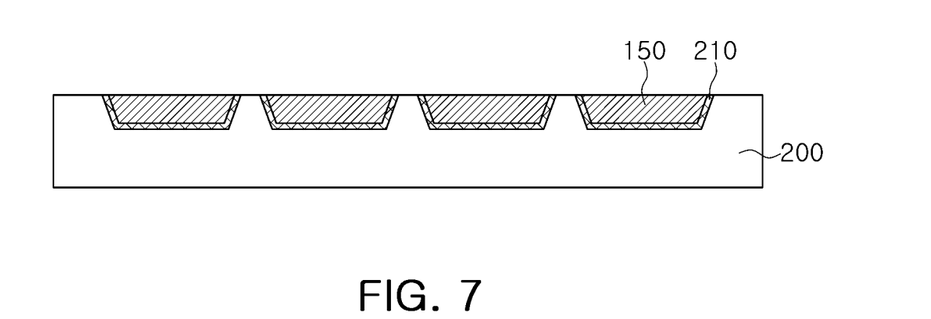

Referring to FIG. 7, an upper surface of the semiconductor substrate 200 may be planarized. The planarization may be performed through a chemical mechanical polishing (CMP) process. When the upper surface of the semiconductor substrate 200 is planarized, the seed layer 210 and the lower pads 150 may be separated as individual units, respectively.

Figure 8:
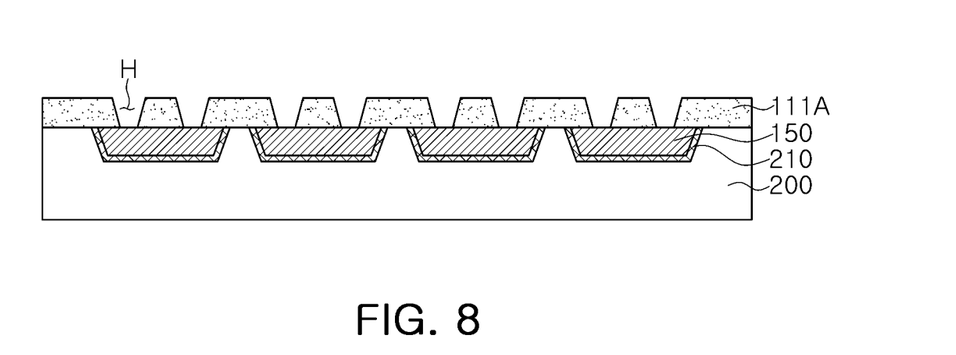

Referring to FIG. 8, an insulating layer 111 may be formed on the upper surface of the semiconductor substrate 200, and patterned to form a hole H penetrating through the insulating layer 111.

The insulating layer 111 may be formed of an insulating material. For example, the insulating layer 111 may include at least one of, for example, $SiO_2$, SiN, and SiCN. In some example embodiments, the insulating layer 111 may include a polyimide material or a polymer such as ploybenzoxazole (PBO). The hole H may be formed by a photolithography process and an etching process to expose portions of the upper surfaces of the lower pads 150.

Figure 9:
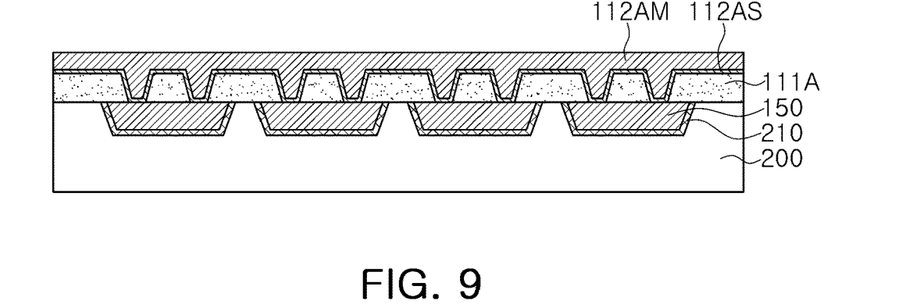

Referring to FIG. 9, a seed layer 112AS may be formed to cover the insulating layer 111, and a metal material layer 112AM covering the seed layer 112AS may be formed by filling a metal material using an electroplating process. Similar to the process of FIG. 6, the metal material layer 112AM may include Cu, and the seed layer 112AS may have a multilayer structure including a lower layer of Ti and an upper layer of Cu.

Figure 10:
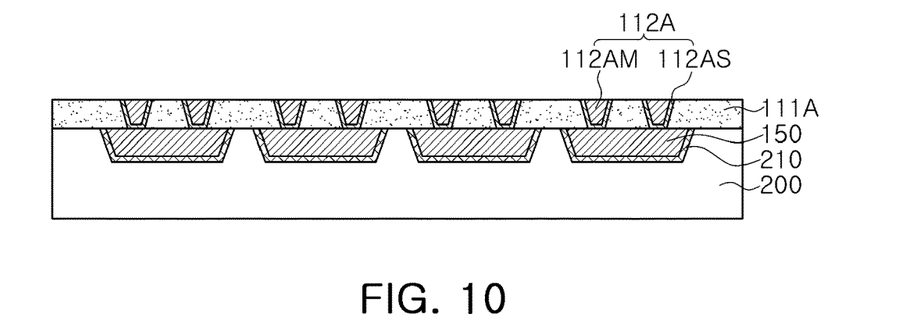

Referring to FIG. 10, an upper surface of the insulating layer 111 may be planarized. The planarization may be performed through a CMP process. When the upper surface of the insulating layer 111 is planarized, the seed layer 112AS and the metal material layer 112AM may be separated as individual units, respectively, to form the lower redistribution via 112 of FIG. 2.

Figure 11:
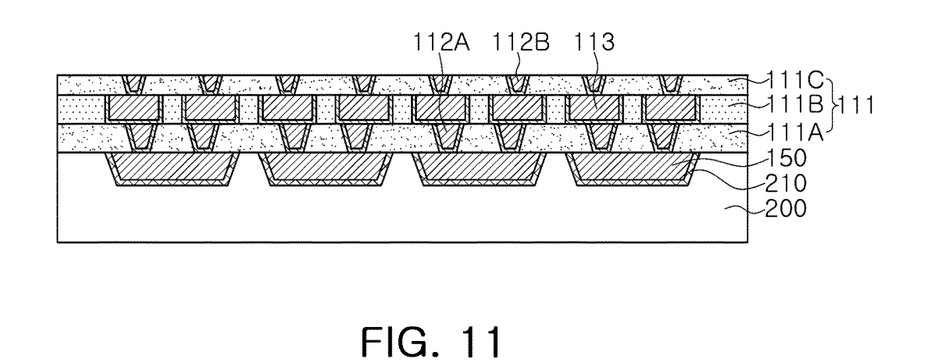

Referring to FIG. 11, a photolithography process, an etching process, a plating process, and the like may be repeatedly performed to form lower redistribution vias 112, redistribution layers 113, and upper redistribution vias 112 formed through the insulating layer 111 and including (e.g.) first, second and third insulating layers 111A, 111B, and 111C, respectively.

Figure 12:
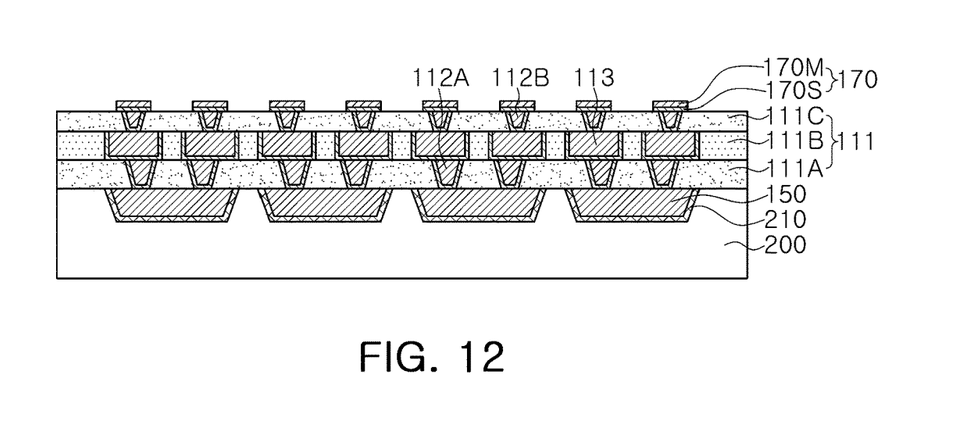

Referring to FIG. 12, upper pads 170 may be formed on the third insulating layer 111C respectively corresponding to the upper redistribution vias 112. The upper pads 170 may be formed by sequentially forming a seed layer 170S and a metal material layer 170M on the third insulating layer 111C and patterning same.

Figure 13:
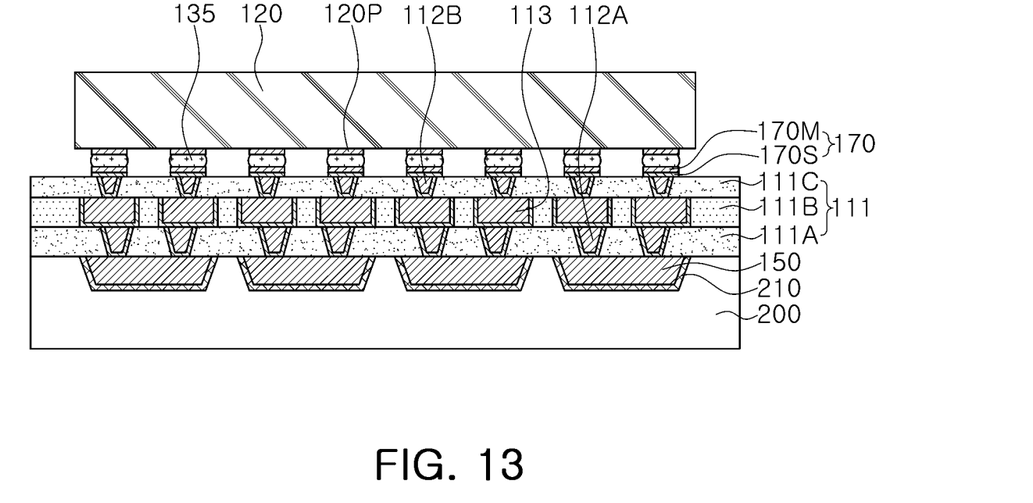

Referring to FIG. 13, the semiconductor chip 120 may be mounted on the upper pads 170 using (e.g.) a solder bonding technique in relation to the connection portions 135. As a result, the semiconductor chip 120 may be physically and electrically connected to the upper pads 170 through the connection portions 135.

Figure 14:
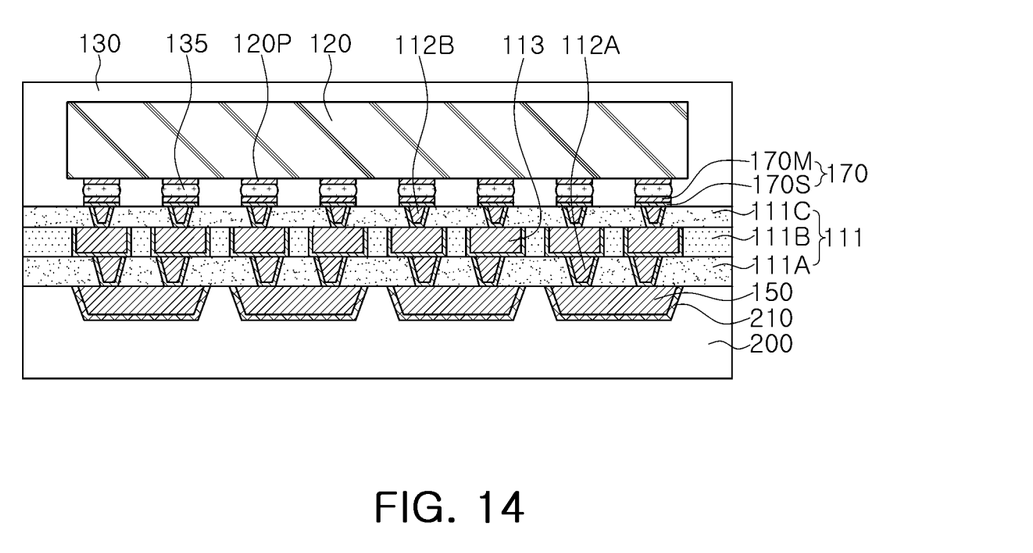

Referring to FIG. 14, an encapsulation layer 130 for molding the semiconductor chip 120 may be formed. The encapsulation layer 130 may be formed to cover the semiconductor chip 120 and to cover an upper surface of the insulating layer 111. The encapsulation layer 130 may be formed by laminating an encapsulating material in a film form or by applying and curing a sealing material in a liquid form. The encapsulation layer 130 may include an insulating material, for example, EMC.

Figure 15:
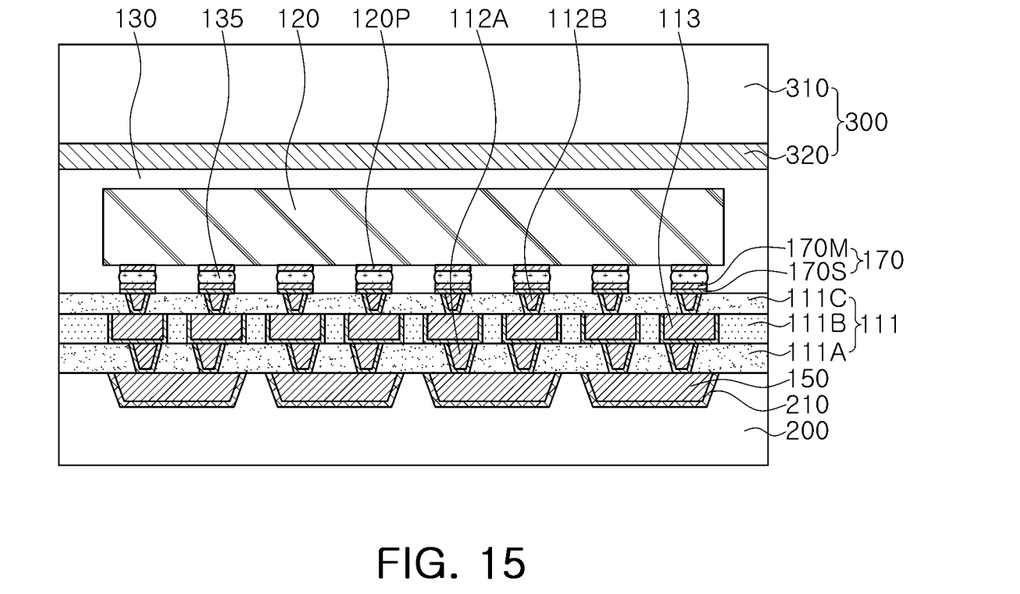

Referring to FIG. 15, a carrier substrate 300 may be attached to an upper surface of the encapsulation layer 130. The carrier substrate 300 may include a core layer 310 and an adhesive layer 320 on a lower surface of the core layer 310. The core layer 310 may be a resin substrate or a glass substrate.

Figure 16:
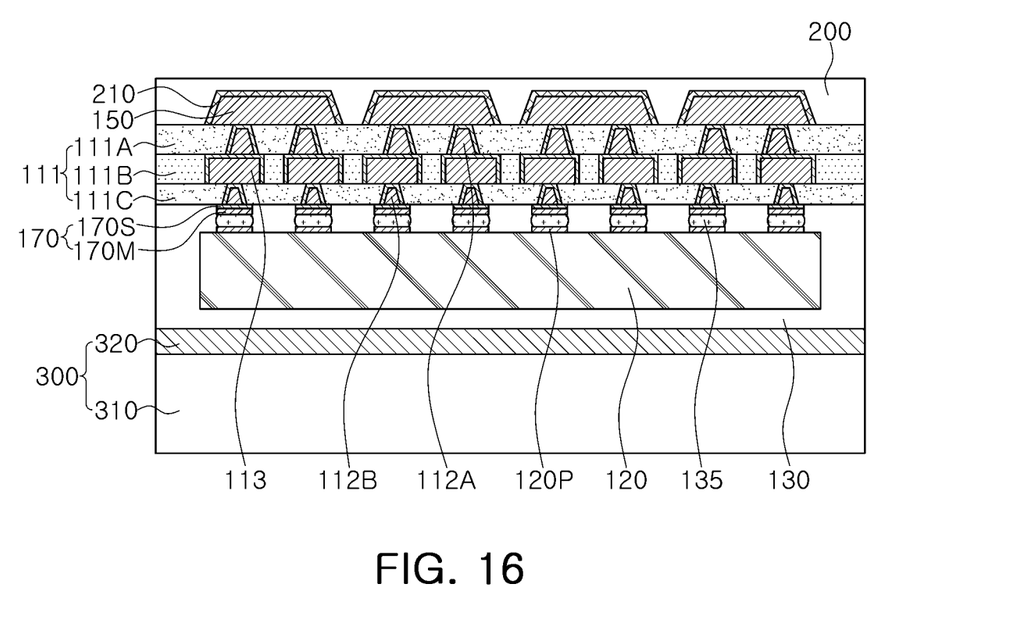

Referring to FIG. 16, the semiconductor substrate 200 may be thinned. The thinning of the semiconductor substrate 200 may be performed through a physical process such as grinding. The semiconductor substrate 200 may be thinned to an extent that the lower pads 150 is not exposed. The thinning of the semiconductor substrate 200 may be performed on the upper surface of the semiconductor substrate 200, after the semiconductor substrate 200 is disposed.

Figure 17:
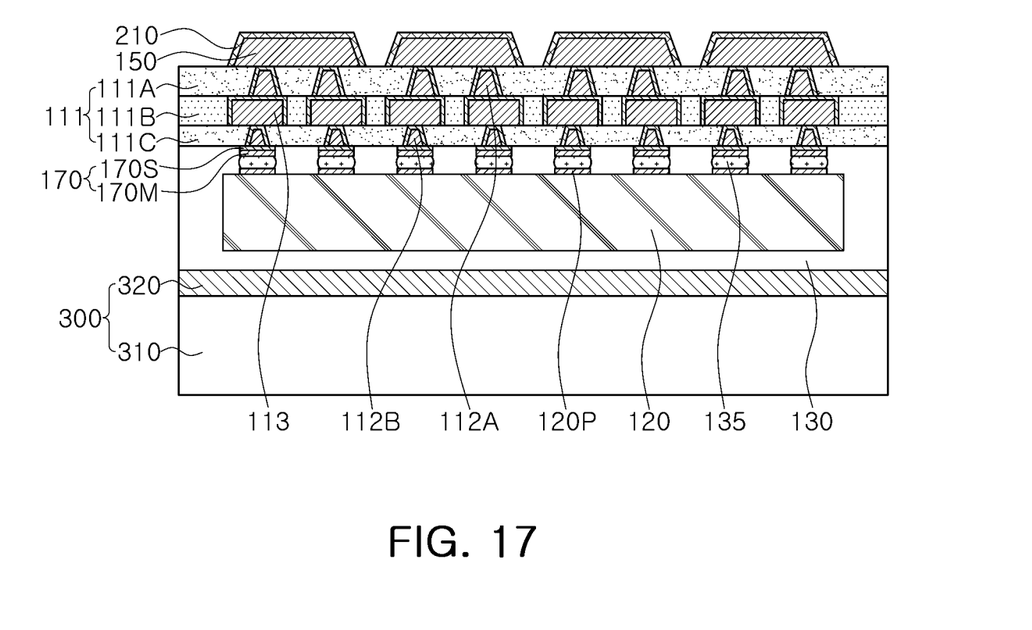

Referring to FIG. 17, the semiconductor substrate 200 of FIG. 16 may be removed by etching. By removing the semiconductor substrate 200, the lower pad 150 may be exposed. The semiconductor substrate 200 may be removed by a CMP process, an etch-back process, or a combination thereof. The seed layer 210 may remain on exposed surfaces of the lower pads 150.

Figure 18:
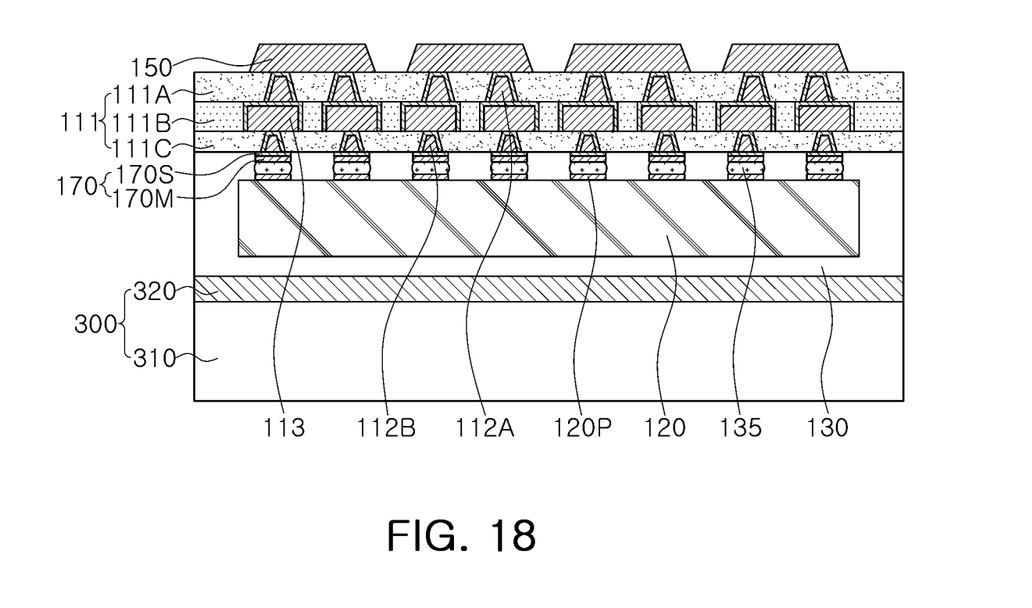

Referring to FIG. 18, the seed layer 210 of FIG. 17 may be removed to expose the lower pads 150. The removal of the seed layer 210 may be performed through a wet etching process using an etching solution capable of selectively removing the seed layer 210.

Figure 19:
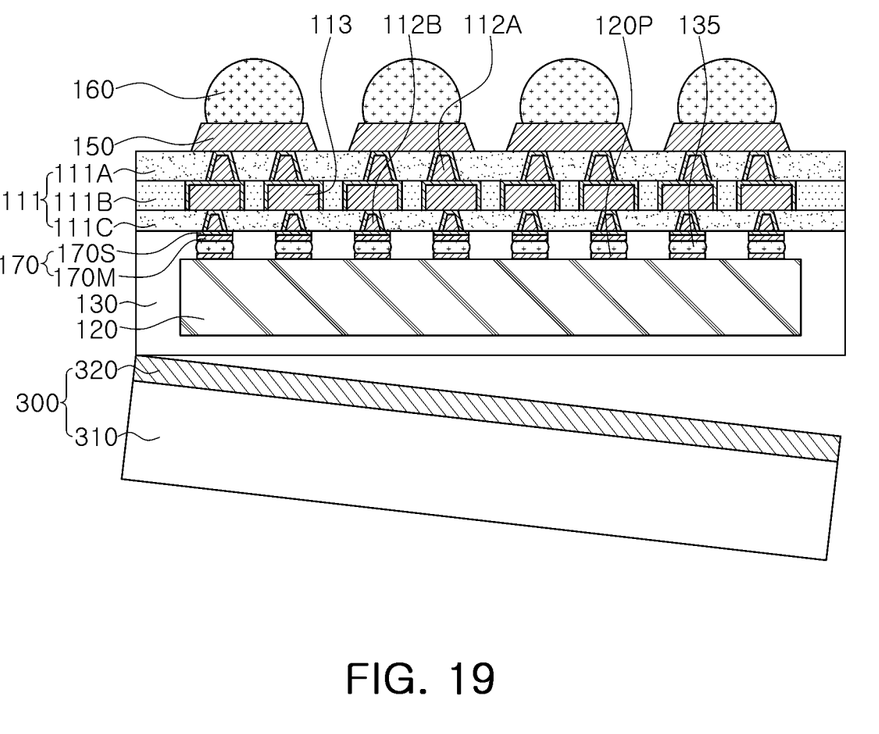

Referring to FIG. 19, the connection bumps 160 may be formed on the lower pads 150, and the carrier substrate 300 may be removed. The connection bumps 160 may be formed, for example, by attaching conductive balls constituting the connection bump 160 and performing a reflow process.

Next, when it is diced in units of individual devices and the package substrate 180 may be attached to the connection bumps 160, and the semiconductor package 100A of FIGS. 1 and 2 may be substantially completed.

According to embodiments of the inventive concept, an interposer substrate associated with a semiconductor package includes neither a silicon substrate nor through electrode(s) penetrating same. Accordingly, as compared with interposer substrates including a silicon substrate and through electrode(s), manufacturing methods used to fabricate semiconductor packages according to embodiments of the inventive concept do not require method steps thinning the silicon substrate, nor method step exposing the through electrode(s). As a result, relatively simple manufacturing methods may be used with attendant savings in cost and time.

Further, since an interposer substrate associated semiconductor packages according to embodiments of the inventive concept includes neither a silicon substrate nor through electrode(s) penetrating the silicon substrate, the interposer substrate may be formed with minimal (or greatly reduced) thickness.

Further, since a seed layer may be removed from lower pads during manufacturing methods used to fabricate semiconductor packages according to embodiments of the inventive concept, metallic connection bumps may directly contact the lower pads. As a result, adhesion between the lower pads and connection bumps may be improved.

Further, since a plating seed layer may be removed from a lower surface of the lower pads, semiconductor package according to embodiments of the inventive concept exhibit improved adhesion of the connection pads, which results in improved overall reliability and more efficient manufacturing.

Additional and other advantages and features associated with embodiments of the inventive concept may be discerned by those skilled in the art upon consideration of the subject specification, including the accompanying drawings.

While the inventive concept has been described in the context of certain illustrated embodiments, those skilled in the art will understand that various modifications and adaptations may be made to same without departing from the scope of the inventive concept as defined by the appended claims.

What is claimed is:

1. A semiconductor package, comprising:
a package substrate;
an interposer substrate on the package substrate and including;
an insulating layer having an upper surface and an opposing lower surface,
an upper pad on the upper surface of the insulating layer,
a lower pad on the lower surface of the insulating layer, and
a redistribution structure penetrating the insulating layer between the upper surface and the lower surface to connect the upper pad and the lower pad;
a semiconductor chip disposed above the interposer substrate and connected to the upper pad; and
a connection bump directly contacting a lower surface of the lower pad,
wherein the redistribution structure includes redistribution layers and redistribution vias connected to the redistribution layers,
each of the redistribution layers and each of the redistribution vias includes a metal material layer and a plating seed layer, and
the lower pad directly contacts the plating seed layer.

2. The semiconductor package of claim 1, wherein an upper surface of the lower pad is disposed at the same level as the lower surface of the insulating layer.

3. The semiconductor package of claim 1, wherein the insulating layer includes at least one of $SiO_2$, SiN, and SiCN.

4. The semiconductor package of claim 3, wherein the insulating layer includes a plurality of insulating layers respectively formed of the same material.

5. The semiconductor package of claim 3, wherein the insulating layer includes a first insulating layer formed of a first material and a second insulating layer formed of a second material different from the first material.

6. The semiconductor package of claim 3, wherein the insulating layer includes an uppermost insulating layer, and intermediate insulating layer and a lowermost insulating layer,
each of the uppermost insulating layer and the lowermost insulating layer includes at least one of polyimide and ploybenzoxazole, and
the intermediate insulating layer includes at least one of $SiO_2$, SiN and SiCN.

7. The semiconductor package of claim 1, wherein the lower pad is formed of the same material as the metal material layer.

8. The semiconductor package of claim 7, wherein the same material includes copper.

9. The semiconductor package of claim 1, wherein the lower pad has an inclined side surface and a width that increases as the lower pad extends vertically upward.

10. The semiconductor package of claim 1, wherein each redistribution via of the redistribution vias has an inclined side surface and a width that increases as the redistribution vias extend vertically upward.

11. The semiconductor package of claim 1, wherein the redistribution vias include at least one power via, at least one ground via, and at least one signal via, and
each of the redistribution vias has a diameter that increases as each of the redistribution vias extends vertically upward.

12. The semiconductor package of claim 11, wherein the at least one power via has a first diameter and the at least one signal via has a second diameter less than the first diameter.

13. The semiconductor package of claim 1, wherein the redistribution vias include upper redistribution vias disposed at a first level and lower redistribution vias disposed at a second level below the first level, and
upper surfaces of the upper redistribution vias have a first diameter, and upper surfaces of the lower redistribution vias have a second diameter greater than the first diameter.

14. The semiconductor chip of claim 1, wherein the interposer substrate has a thickness ranging from about 2.4 μm to about 10 μm.

15. The semiconductor package of claim 1, wherein a width of the upper pad is less than a width of the lower pad.

16. The semiconductor package of claim 1, further comprising:
an encapsulation layer covering at least a side surface of the semiconductor chip and an upper surface of the interposer substrate.

17. A semiconductor package, comprising:
an interposer substrate including an insulating layer, an upper pad on an upper surface of the insulating layer, a lower pad on a lower surface of the insulating layer, and a redistribution structure penetrating through the insulating layer to connect the upper pad and the lower pad;
a semiconductor chip disposed above the interposer substrate and connected to the upper pad; and
a connection bump directly contacting a lower surface of the lower pad,
wherein the redistribution structure includes a redistribution layer and a redistribution via connected to the redistribution layer,
the redistribution layer includes a first plating seed layer extending along a side surface and a lower surface of the redistribution layer,
the redistribution via includes a second plating seed layer extending along a side surface and a lower surface of the redistribution via, and
the lower pad directly contacts the second plating seed layer.

18. The semiconductor package of claim 17, wherein the insulating layer includes at least one of $SiO_2$, SiN, and SiCN,
the lower pad includes copper, and
at least one of the first plating seed layer and the second plating seed layer includes a material different from that of the lower pad.

19. A semiconductor package, comprising:
a package substrate;
an interposer substrate on the package substrate and including an insulating layer, an upper pad on an upper surface of the insulating layer, a lower pad on a lower surface of the insulating layer, and a redistribution structure penetrating through the insulating layer to connect the upper pad and the lower pad; and
a semiconductor chip disposed above the interposer substrate and connected to the upper pad,
wherein the insulating layer includes at least one of $SiO_2$, SiN, and SiCN,
the redistribution structure includes a redistribution layer and a redistribution via connected to the redistribution layer,
the redistribution layer includes a first plating seed layer extending along a side surface and a lower surface of the redistribution layer,
the redistribution via includes a second plating seed layer extending along a side surface and a lower surface of the redistribution via, and
the lower pad directly contacts the second plating seed layer.

20. The semiconductor package of claim 19, wherein the interposer substrate has a thickness ranging from about 2.4 μm to about 10 μm.

* * * * *